(12) United States Patent
Shima et al.

(10) Patent No.: US 7,518,188 B2
(45) Date of Patent: Apr. 14, 2009

(54) P-CHANNEL MOS TRANSISTOR AND FABRICATION PROCESS THEREOF

(75) Inventors: Masashi Shima, Kawasaki (JP); Yosuke Shimamune, Kawasaki (JP); Akiyoshi Hatada, Kawasaki (JP); Akira Katakami, Kawasaki (JP); Naoyoshi Tamura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/180,791

(22) Filed: Jul. 14, 2005

(65) Prior Publication Data

US 2006/0202280 A1    Sep. 14, 2006

(30) Foreign Application Priority Data

Mar. 9, 2005    (JP)    ............... 2005-066029

(51) Int. Cl.
    H01L 29/76    (2006.01)
(52) U.S. Cl. .................. 257/347; 257/616; 257/19; 257/E33.009
(58) Field of Classification Search .................. 257/616, 257/19, E33.009, 347, 33.009
    See application file for complete search history.

(56) References Cited

U.S. PATENT DOCUMENTS

| 5,733,793 | A * | 3/1998 | Song et al. ................ 438/163 |
| 6,255,214 | B1 * | 7/2001 | Wieczorek et al. .......... 438/659 |
| 6,872,642 | B2 * | 3/2005 | Oda et al. ................... 438/528 |
| 6,900,667 | B2 * | 5/2005 | Bhattacharyya ............. 326/103 |
| 7,118,979 | B2 * | 10/2006 | Liu et al. .................... 438/302 |

FOREIGN PATENT DOCUMENTS

JP    2002-329864    11/2002

OTHER PUBLICATIONS

A. Shimizu et al., Local Mechanical-Stress Control (LMC): A New Technique for CMOS-Performance Enhancement, IEDM 2001 Tech. Dig. p. 433 (2001).
Y. Nakahara et al., A Robust 65-nm Node CMOS Technology for Wide-range Vdd Operation, IEDM 2001 Tech. Dig. p. 281 (2003).
Chien-Hao Chen et al., Stress Memorization Technique (SMT) by Selectively Strained-Nitride Capping for Sub-65 nm . . . , 2004 Symposium on VLSI Technology Digest of Technical Papers, pp. 56-57.
T. Ghani et al., A 90 nm High Volume Manufacturing Logic Technology Featuring Novel 45nm Gate Length Strained . . . , IEDM 2003, pp. 978-980, Jun. 10, 2003.
K. Ota et al., Novel Locally Strained Channel Technique for High Performance 55nm CMOS, IEDM Tech. Dig. p. 27 (2003).

* cited by examiner

*Primary Examiner*—Eugene Lee
(74) *Attorney, Agent, or Firm*—Westerman, Hattori, Daniels & Adrian, LLP.

(57) ABSTRACT

A p-channel MOS transistor includes a gate electrode formed on a silicon substrate in correspondence to a channel region therein via a gate insulation film, the gate electrode carrying sidewall insulation films on respective sidewall surfaces thereof, and source and drain regions of p-type are formed in the substrate at respective outer sides of the sidewall insulation films, wherein each of the source and drain regions encloses a polycrystal region of p-type accumulating therein a compressive stress.

9 Claims, 8 Drawing Sheets

P-CHANNEL MOS TRANSISTOR AND FABRICATION PROCESS THEREOF

CROSS-REFERENCE TO RELATED APPLICATION

The present application is based on Japanese priority application No. 2005-066029 filed on Mar. 9, 2005, the entire contents of which are hereby incorporated by reference.

BACKGROUND OF THE INVENTION

The present invention generally relates to semiconductor devices and more particularly to a semiconductor integrated circuit device including a stressed semiconductor device for improved operational speed and fabrication process thereof.

With progress in the art of device miniaturization, it is now possible to fabricate ultrafine and ultra high-speed semiconductor devices having a gate length of less than 100 nm.

With such ultrafine and ultra high-speed transistors, the area of the channel region right underneath the gate electrode is extremely reduced as compared with conventional semiconductor devices, and thus, the mobility of electrons or holes traveling through the channel region is influenced heavily by the stress applied to such a channel region.

Thus, various attempts have been undertaken to improve the operational speed of semiconductor devices by optimizing the stress applied to such a channel region.

REFERENCES

PATENT REFERENCE 1 Japanese Laid-Open Patent Application 2002-329864
NON-PATENT REFERENCE 1 Shimizu. A., et al. IEDM2001 Tech. Dig. p. 433, 2001
NON-PATENT REFERENCE 2 Nakahara, Y., et al. IEDM2003 Tech. Dig. p. 281, 2003
NON-PATENT REFERENCE 3 Chen, C., et al., 2004 Symposium on VLSI Technology Digest of Technical Papers, pp. 56-57
NON-PATENT REFERENCE 4 Ghani, T., t al., IEDM2003, 978-980, Jun. 10, 2003
NON-PATENT REFERENCE 5 Ota, K., IEDM Tech. Dig. p. 27, 2003

SUMMARY OF THE INVENTION

Conventionally, there is a known construction of an n-channel MOS transistor to improve the operational speed thereof, by forming a stressor film accumulating therein a tensile stress such as an SiN film in the device region of the n-channel MOS transistor so as to include the gate electrode for the purpose of increasing the electron mobility in the channel region right underneath the gate electrode.

FIG. 1 shows the construction of an n-channel MOS transistor formed on a silicon substrate 1 with such a stressor film.

Referring to FIG. 1, there is formed a device region 1A on the silicon substrate 1 as the device region of the n-channel MOS transistor in the form of p-well such that the device region 1A is defined by an STI device isolation region 1I, and a gate electrode 3 is formed on the silicon substrate 1 in correspondence to a channel region in the device region 1A via a gate insulation film 2. Further, source and drain extension regions 1a and 1b are formed in the silicon substrate 1 at both lateral sides of the gate electrode 3.

Further, sidewall insulation films 3A and 3B are formed on respective sidewall surfaces of the gate electrode 3, and diffusion regions 1c and 1d of $n^+$-type are formed in the silicon substrate 1 at respective outer regions of the sidewall insulation films 3A and 3B with overlapping relationship with the source and drain extension regions 1a and 1b.

Further, silicide layers 4A and 4B are formed on the respective surfaces of the source and drain diffusion regions 1c and 1d, and a silicide layer 4C is formed on the gate electrode 3.

Further, in the construction of FIG. 1, there is formed an SiN film 5 accumulating therein a tensile stress on the silicon substrate 1 so as to cover a gate structure including the gate electrode 3, the sidewall insulation films 3A and 3B and the silicide layer 4C.

It should be noted that such a tensile stressor film 5 urges the gate electrode 3 to the silicon substrate 1, and as a result, a compressive stress is applied to the channel region right underneath the gate electrode 3 in the direction perpendicular to the substrate surface, while such a compressive stress induces a strain equivalent to the case in which a tensile stress (in-plane tensile stress) is applied to the substrate 1 in the direction parallel to the substrate surface.

With such a construction, symmetry of the Si crystal constituting the channel region is locally modulated, and scattering of electrons between crystallographically equivalent states is suppressed. Thereby, the electron mobility is improved in the channel region and the operational speed of the n-channel MOS transistor is improved.

Meanwhile, it is known that the mobility of carriers is improved in a p-channel MOS transistor that uses holes for the carriers by applying a uniaxial compressive stress to the channel region, and there is proposed a construction shown in FIG. 2 as the means of applying such a compressive stress to the channel region (Non-Patent Reference 4).

Referring to FIG. 2, there is formed a gate electrode 13 on the silicon substrate 11 in correspondence to the channel region via a gate insulation film 12, and p-type diffusion regions 11a and 11b are formed in the silicon substrate 11 at respective lateral sides of the gate electrode 13 so as to define the channel region. Further, sidewall insulation films 13A and 13B are formed on respective sidewall surfaces of the gate electrode 13.

It should be noted that the diffusion regions 11a and 11b function respectively as the source extension region and the drain extension region of the MOS transistor and the flow of the holes transported through the channel region right underneath the gate electrode 13 from the diffusion region 11a to the diffusion region 11b is controlled by a gate voltage applied to the gate electrode 13.

In the construction of FIG. 2, there are further formed SiGe mixed crystal layers 11A and 11B in the silicon substrate 11 at respective outer sides of the sidewall insulation films 13A and 13B in an epitaxial relationship with the silicon substrate 1, and source and drain regions of p-type are formed in the SiGe mixed crystal layers 11A and 11B respectively in continuation to the diffusion regions 11a and 11b.

In the p-channel MOS transistor of the construction of FIG. 2, the SiGe mixed crystal layers 11A and 11B have a lattice constant larger than that of the silicon substrate 11, and thus, there is induced a compressive stress shown by an arrow a in the SiGe mixed crystal layers 11A and 11B, and as a result, the SiGe mixed crystal layers 11A and 11B undergo straining such that the SiGe mixed crystal layers 11A and 11B expand in the direction generally perpendicular to the surface of the silicon substrate 11 indicated by an arrow b.

Because the SiGe mixed crystal layers 11A and 11B are formed epitaxially with respect to the silicon substrate 11, such a straining of the SiGe mixed crystal layers 11A and 11B indicated by the arrow b induces a corresponding strain in the channel region of the silicon substrate 11 as indicated by an arrow c, while the channel region of the silicon substrate 11 undergoes contraction in the channel direction as shown by arrows d as a result of such a straining. Thereby, there is inducted a state in the channel region equivalent to the case in which a uniaxial compressive stress is applied as represented by arrows d.

In the case of the p-channel MOS transistor of FIG. 2, symmetry of the Si crystal constituting the channel region is modulated locally as a result of such a deformation of the channel region corresponding to such a uniaxial compressive stress, while such a change of symmetry causes resolves degeneration of heavy holes and light holes in the valence band. Thereby, there is caused increase of hole mobility in the channel region, while this leads to improvement of the operational speed of the p-channel MOS transistor. It should be noted that such increase of hole mobility, caused by the locally induced stress in the channel region and associated improvement of the transistor operational speed, appears particularly conspicuously in the ultrafine semiconductor devices having a gate length of 100 nm or less.

The present invention provides further increase of operational speed in such a stressed semiconductor device, particularly a p-channel MOS transistor having improved operational speed as a result of stressing, by increasing the stress applied to the channel region further.

Further, the present invention provides low-cost method of fabricating such a stressed semiconductor device having improved operational speed as a result of stressing, as well as a semiconductor device fabricated according to such a method.

In a first aspect, the present invention provides a p-channel MOS transistor, comprising:

a silicon substrate;

a gate electrode formed on said silicon substrate in correspondence to a channel region therein via a gate insulation film, said gate electrode carrying sidewall insulation films on respective sidewall surfaces thereof; and source and drain regions of p-type formed in said substrate at respective outer sides of said sidewall insulation films, each of said source and drain regions enclosing therein a polycrystal region of p-type, said polycrystal region accumulating therein a compressive stress.

In another aspect, the present invention provides a fabrication method of a p-channel MOS transistor, comprising the steps of:

forming a gate electrode on a silicon substrate in correspondence to a channel region via a gate insulation film;

forming sidewall insulation films on respective sidewall surfaces of said gate electrode; and forming a source region and a drain region of p-type in said silicon substrate at respective outer sides of said sidewall insulation films, said step of forming said source region and drain region of p-type comprising the steps of:

forming first and second regions respectively enclosed in said source and drain regions in an amorphous state; and crystallizing said first and second regions to convert said first and second regions to a polycrystalline state accumulating therein a compressive stress.

In another aspect, the present invention provides a method of fabricating a p-channel MOS transistor, comprising the steps of:

forming a gate electrode on a silicon substrate in correspondence to a channel region via a gate insulation film;

forming sidewall insulation films on respective sidewall surfaces of said gate electrode; and forming source and drain regions of p-type in said silicon substrate at respective outer sides of said sidewall insulation films, said step of forming said source and drain regions of p-type comprising the step of forming first and second regions so as to be enclosed respectively in said source and drain regions in the form of a polycrystalline state accumulating therein a compressive stress.

According to the present invention, it becomes possible to increase the compressive stress applied to the channel region of the p-channel MOS transistor in the channel direction, by forming a polycrystalline region accumulating therein a compressive stress with regard to the silicon substrate, such that the polycrystalline region is formed in the silicon substrate on which the p-channel MOS transistor is formed in such a manner that the polycrystalline region is enclosed in the source and drain regions of the p-channel MOS transistor. Thereby, it becomes possible to increase the operational speed of the p-channel MOS transistor further.

With the present invention that uses a polycrystalline region as the stressor to the channel region, it becomes possible to introduce an impurity element of large atomic radius such as In, which could not be used for the stressor in the conventional art, in which the stressor is formed in a single crystal (monocrystalline) state. Thereby, it becomes possible with the present invention to introduce the impurity element with a concentration not possible with conventional single crystal stressor region. It should be noted that such impurity element may be introduced by using a cluster ion beam. With this, it becomes possible to accumulate a larger compressive stress in the polycrystalline region.

Further, according to the present invention, it becomes possible to reduce the cost of the semiconductor device by forming the polycrystalline region by way of ion implantation process.

Other objects and further features of the present invention will become apparent from the following detailed description when read in conjunction with the attached drawings.

DETAILED DESCRIPTION OF THE INVENTION

First Embodiment

Figure 3:
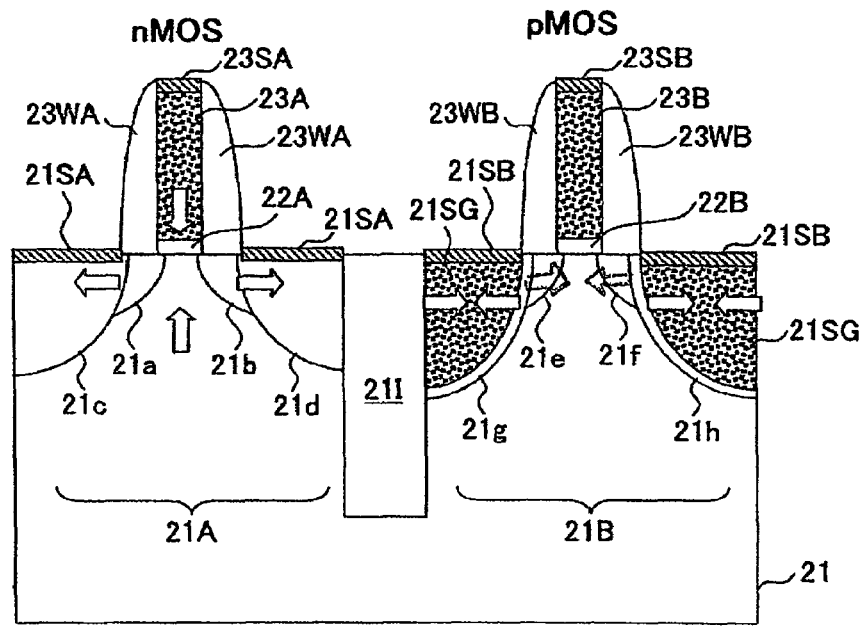
FIG. 3 is a diagram showing the construction of a CMOS integrated circuit device according to a first embodiment of the present invention.

FIG. 3 is a diagram showing the construction of a semiconductor integrated circuit device 20 according to a first embodiment of the present invention.

Referring to FIG. 3, there is formed a device region 21A of an n-channel MOS transistor and a device region 21B of a p-channel MOS transistor on a silicon substrate 21 by a device isolation region 21I, wherein there is formed a polysilicon gate electrode 23A on the silicon substrate 21 in correspondence to the channel region of the n-channel MOS transistor in the device region 21A via a gate insulation film 22A of SiON, or the like.

Further, source and drain extension regions 21a and 21b of n-type are formed in the silicon substrate 21 in correspondence to the device region 21A at both lateral sides of the polysilicon gate electrode 23A.

The polysilicon gate electrode 23A carries sidewall insulation films 23A on the respective sidewall surfaces thereof, and diffusion regions 21c and 21d of n$^+$-type are formed in the silicon substrate 21 at respective outer sides of the sidewall insulation films 23WA as the source and drain regions of the n-channel MOS transistor. Further, in the construction of FIG. 3, a silicide layer 21SA is formed on the surface of the source and drain regions 21c and 21d, and a similar silicide layer 23SA is formed further on the polysilicon gate electrode 23A.

The polysilicon gate electrode 23 is doped with As or Ge after formation of the sidewall insulation films 23WA by an ion implantation process typically with a high concentration level of $5 \times 10^{18}$ cm$^{-3}$. Thereby, the gate electrode 23A undergoes dilatation, and the channel region of the n-channel MOS transistor is applied with a compressive stress in the direction perpendicular to the surface of the silicon substrate 11 as represented in FIG. 3 with an arrow.

Figure 1:
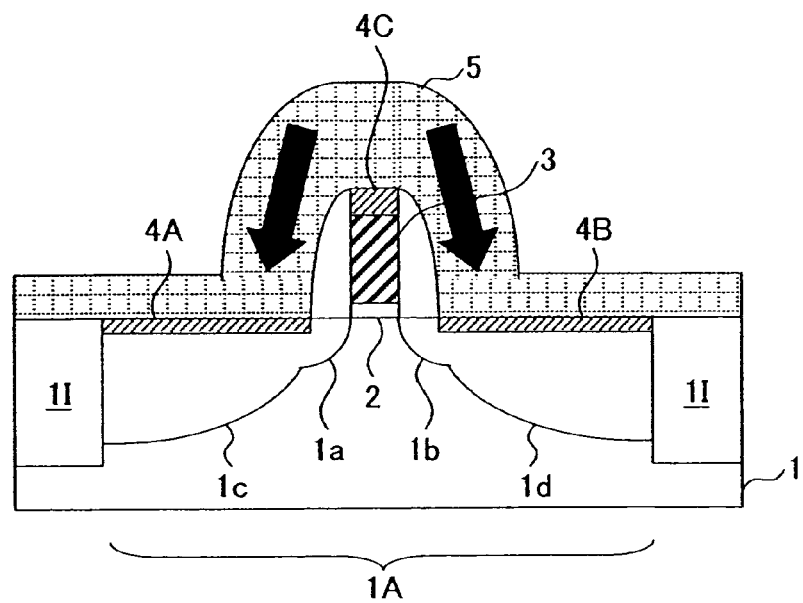
FIG. 1 is a diagram showing the principle of a conventional stressed n-channel MOS transistor.

With this, the Si crystal constituting the channel region causes expansion in the channel direction according to the mechanism similar to the one explained previously with reference to FIG. 1, while such deformation of the Si crystal causes local modulation in the symmetry of the Si crystal, and such local modulation of symmetry of the Si crystal causes increase of electron mobility in the channel region. Thereby the operational speed of the n-channel MOS transistor is improved.

In the device region 21B, on the other hand, there is formed a polysilicon gate electrode 23B on the silicon substrate 21 in correspondence to the channel region of the p-channel MOS transistor via a gate insulation film 22B of SiON, or the like, and source and drain extension regions 21e and 21f of p-type are formed in the silicon substrate 21 at respective lateral sides of the polysilicon gate electrode 23B in correspondence to the device region 21B.

The polysilicon gate electrode 23B carries on the respective sidewall surfaces thereof sidewall insulation films 23WB, and diffusion regions 21g and 21h of p$^+$-type are formed in the silicon substrate 21 at respective outer sides of the sidewall insulation films 23WB as the source and drain regions of the p-channel MOS transistor. Further, a silicide layer 21SB is formed on the surface of the source regions 21g and 21h, and a similar silicide layer 23SB is formed also on the polysilicon gate electrode 23B.

Further, in the p-channel MOS transistor formed in the device region 21B, there are formed a polycrystalline regions 21G in the silicon substrate 21 so as to be enclosed in the source and drain regions 21g and 21h respectively, such that the polycrystalline regions 21G contains an impurity element having an atomic radius larger than that of Si such as In, Ge, or the like, with a concentration level close to the solubility limit for maintaining the monocrystalline state or beyond such a solubility limit, such as $1 \times 10^{19}$ cm$^{-3}$ or more. Particularly, in the case Ge is used for the impurity element, the polycrystalline regions 21SG are formed of a SiGe mixed crystal.

The Si crystal constituting such a polycrystalline region 21SG contains the impurity element not only at the lattice sites but also in the interstitial sites, and each crystal grains causes dilatation with regard to the Si crystal constituting the silicon substrate 21. Thus, there is accumulated a compressive stress in such regions 21SG as represented in FIG. 3 by arrows, and as a result, there is caused increase of hole mobility in the channel region according to the mechanism similar to that explained with reference to FIG. 2. Thereby, the operational speed of the p-channel MOS transistor is increased.

By forming the source and drain regions 21g and 21h of p$^+$-type Si so as to enclose the polycrystalline region 21SG except for the substrate surface as represented in FIG. 3, occurrence of junction leak current between such source/drain region and the n-type well constituting the device region 21B is suppressed.

Second Embodiment

Hereinafter, the fabrication process of a semiconductor integrated circuit device 20 of FIG. 3 will be explained with reference to FIGS. 4-8.

Figure 4:
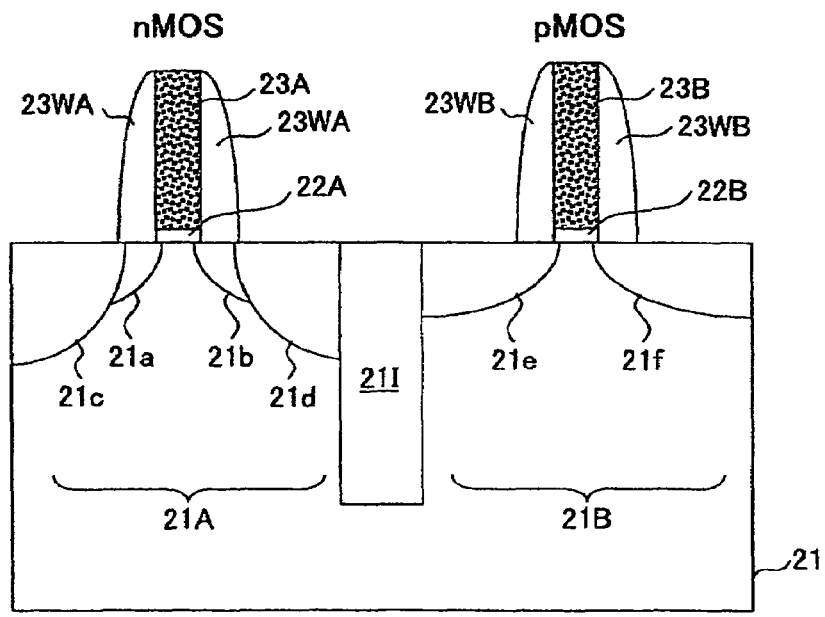
FIGS. 4-8 are diagrams showing the fabrication process of a CMOS integrated circuit device according to a second embodiment of the present invention.

Referring to FIG. 4, the silicon substrate 21 is already formed with the n-channel MOS transistor of FIG. 3 in the device region 21A, and thus, the device region 21B is formed with the gate insulation film 22B, the gate electrode 23B, the sidewall insulation films 23WB and the source and drain extension regions 21e and 21f.

In the state of FIG. 4, it should be noted that the gate electrode 23A in the device region 21A is introduced with As or Ga with high concentration level, and as a result, the gate electrode 23A is formed to have amorphous state.

Figure 5:
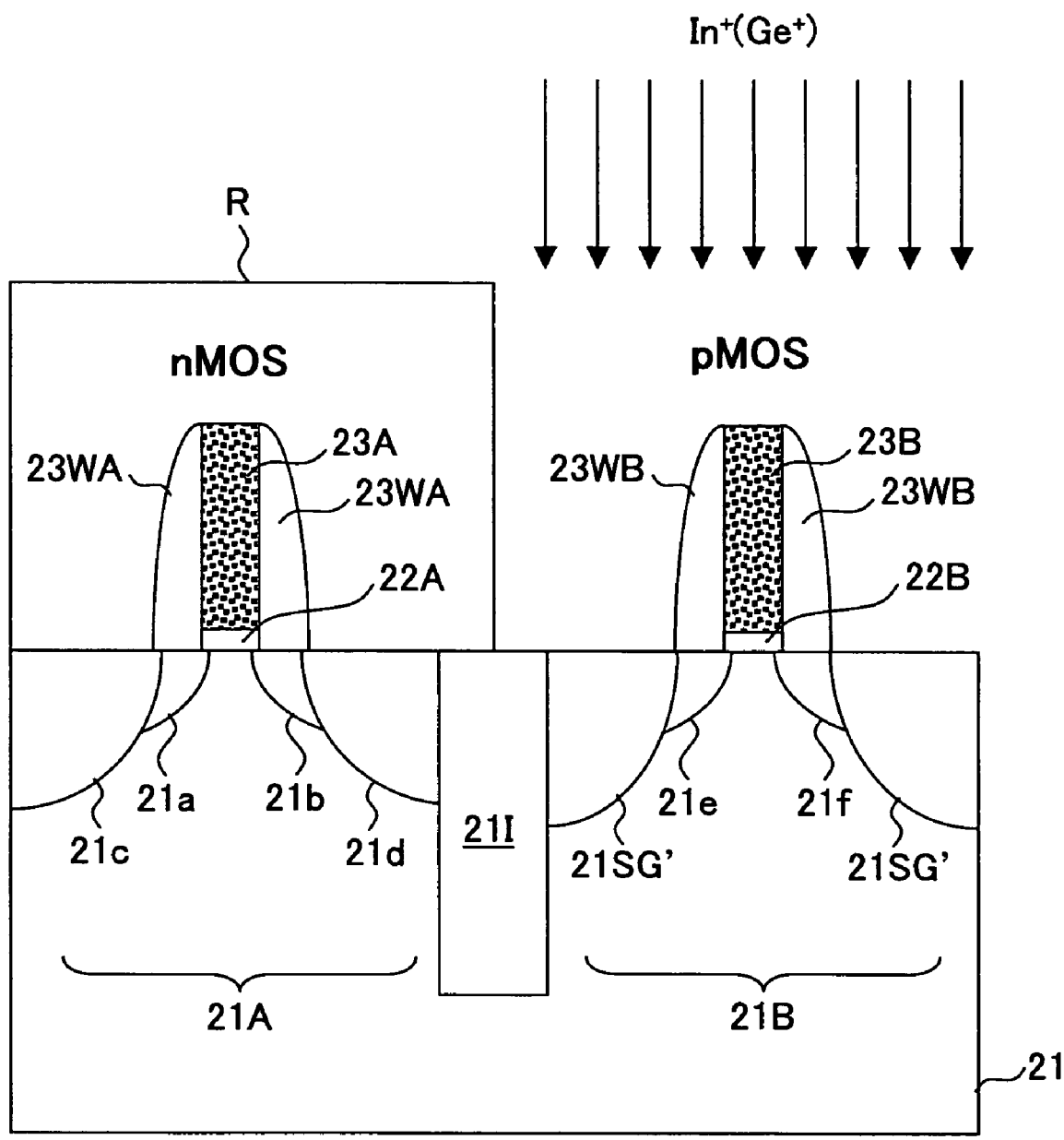

Next, in the step of FIG. 5, the device region 21A is covered with a resist film R, and In$^+$ or Ge$^+$ is introduced into the substrate 21 under the acceleration voltage of 10-40 keV with a dose of $1 \times 10^{14}$-$2 \times 10^{15}$ cm$^{-2}$ while using the gate electrode 23B and the sidewall insulation films 23WB as a self-alignment mask. With this, a highly doped region 21SG' is formed in the silicon substrate 21 in correspondence to the device region 21B at the respective outer sides of the sidewall insulation films 23WB. In this ion implantation step of FIG. 5, it is possible to protect the gate insulation film 23B by a resist pattern.

Figure 6:
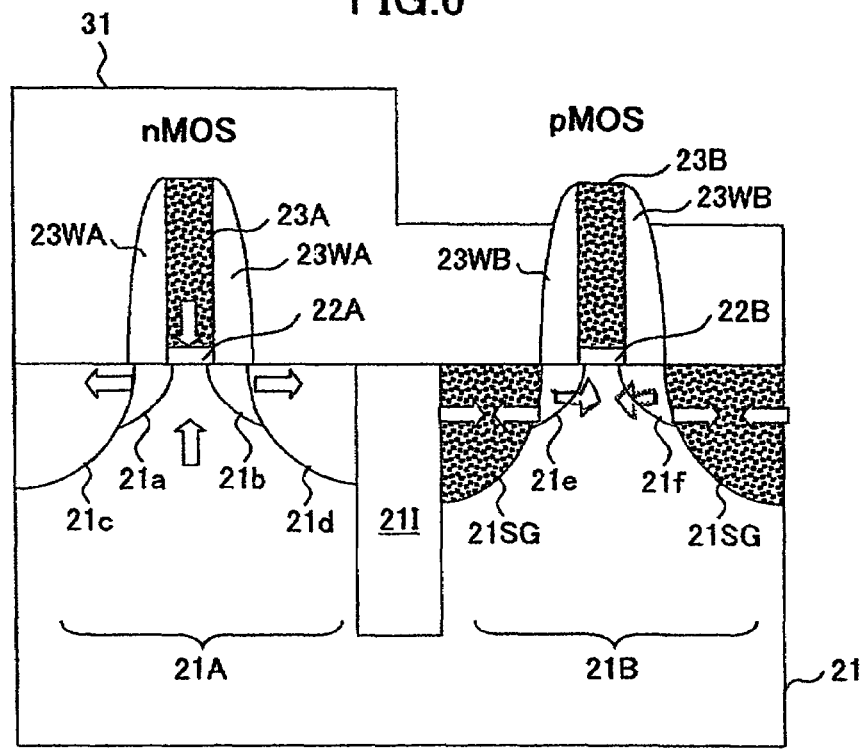

Next, in the step of FIG. 6, a silicon oxide film 31 having a rigidity is formed on the structure of FIG. 5 by a CVD process so as to cover the gate electrode 23A of the n-channel MOS transistor while exposing the gate electrode 23B of the p-channel MOS transistor, and crystallization is made in the foregoing doped regions 21SG' by annealing the structure thus obtained at 1000° C. for several seconds. With this, there are formed polycrystalline regions 21SG in correspondence to the foregoing doped regions 21SG'. Thereby, it should be noted that, because the doped regions 21SG' are injected with the impurity element with the concentration level near or beyond the solubility limit of Si crystal, the foregoing regions 21SG do not form an epitaxial monocrystalline region to the silicon substrate 21 anymore when the recrystallization process of FIG. 6 is applied.

Figure 2:
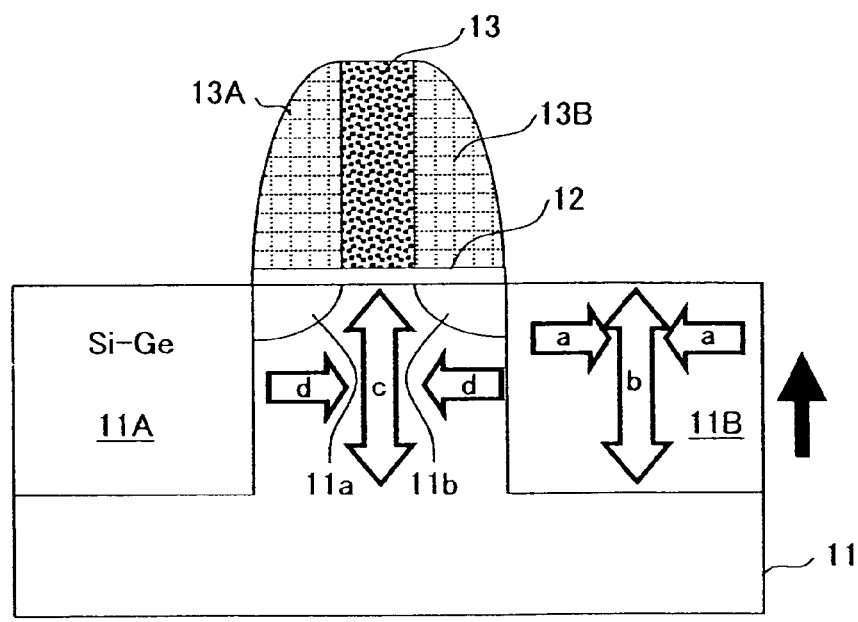
FIG. 2 is a diagram showing the principle of a conventional stressed p-channel MOS transistor.

As a result of such crystallization, the polycrystalline region 21SG, doped heavily with the impurity element of large atomic radius, undergoes dilatation as represented in FIG. 6, and as a result thereof, a uniaxial compressive stress is applied to the channel region of the p-channel MOS transistor in the channel direction according to the mechanism explained with reference to FIG. 2.

In the step of FIG. 6, it should be noted that the gate electrode 23A of the n-channel MOS transistor undergoes crystallization at the same time to the foregoing crystallization of the polycrystalline regions 21SG, while such crystallization of the gate electrode 23A, caused in the state in which the gate electrode 23A is covered by the CVD oxide film 31 in the device region 21A, does not allow relaxation of the stress accumulated therein, and a large compressive stress is applied to the channel region of the n-channel MOS transistor in the direction perpendicular to the substrate surface with the dilatation of the gate electrode 23A associated the crystallization thereof. Thereby, a large in-plane tensile stress is applied to the channel region of the n-channel MOS transistor.

On the other hand, in the step of FIG. 6, it should be noted that the CVD oxide film 31 is formed so as to expose the gate electrode 23B of the p-channel MOS transistor. Because of this, the dilatational stress induced in the polysilicon gate electrode 23B in the crystallization step of FIG. 6 is effectively relaxed, and no effective compressive stress is applied to the channel region of the p-channel MOS transistor in spite of the fact that the impurity element of large atomic radius is introduced into the polysilicon gate electrode 23B. Thereby, there is caused no cancellation in the improvement of the operational speed of the p-channel MOS transistor with the in-plane compressive stress induced by the polycrystalline regions 21SG.

Figure 7:
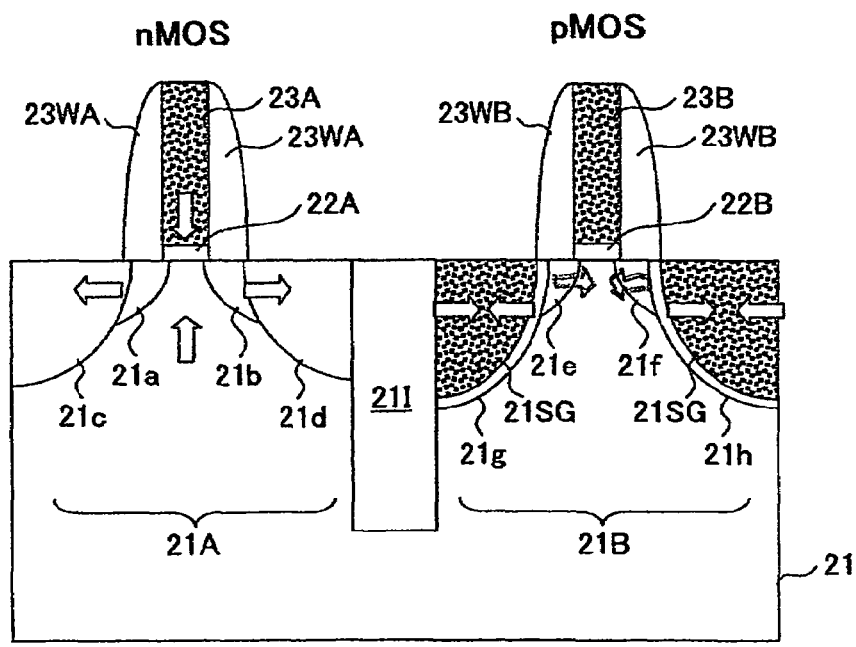

Next, in the step of FIG. 7, a p-type impurity element such as As is introduced into the device region 21B of the p-channel MOS transistor typically under an acceleration voltage of 100 keV with the dose of $3\times10^{13}$ cm$^{-2}$ by way of an ion implantation process, and with this, the source and drain regions 21g and 21h of p$^+$-type are formed so as to enclose the polycrystalline regions 21SG except for the substrate surface.

Further, by forming the silicide layers 21SA on the source and drain regions 21c and 21d of n$^+$-type, the silicide layers 21SB on the source and drain regions 21g and 21h of p$^+$-type, the silicide layer 23SA on the polysilicon gate electrode 23A of n$^+$-type, and further the silicide layer 23SB on the polysilicon gate electrode 23B of p$^+$-type, the CMOS device explained with reference to FIG. 3 is obtained.

Figure 8:
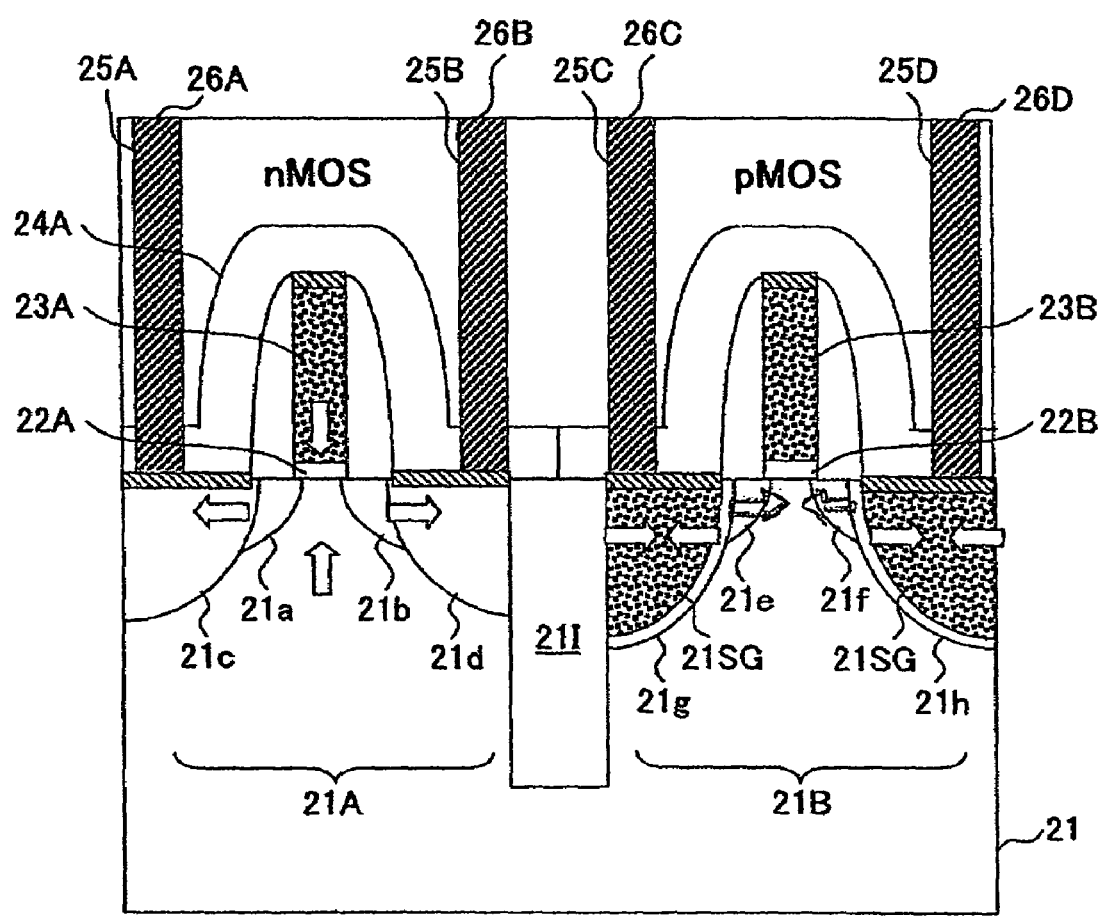

Next, in the step of FIG. 8, an SiN film 24A accumulating therein a tensile stress is formed on the structure of FIG. 3 so as to cover the silicon substrate 21 and the gate electrode 23A continuously in the device region 21A, while an SiN film 24B free from stress or accumulating therein a compressive stress is formed on the device region 21B so as to cover the silicon substrate 21 and the gate electrode 23B continuously.

Further, an interlayer insulation film 25 is formed so as to cover the SiN films 24A and 23B, and contact holes 25A and 25B are formed in the interlayer insulation film 25 so as to expose the silicide layers 21SA covering the source and drain regions 21c and 21d respectively, while using the SiN film 24A as a contact etching stopper. Similarly, there are formed contact holes 25C and 25D in the interlayer insulation film 25 so as to expose the silicide layers 21SB covering the source and drain regions 21g and 12h respectively, while using the SiN film 24B as a contact etching stopper. Further, the contact holes 25A-25D are filled respectively with W plugs 26A-24D, and a CMOS device having an interconnection structure on the structure of FIG. 3 is obtained.

In the ion implantation process of FIG. 5 explained before, it is also possible to inject cluster ions of p-type dopant such as the cluster ions of B$_2$H$_6$ as the impurity element in place of In or Ge. With the use of such cluster ions, a large number of atoms such as 1000 atoms are injected into the region 21SG in the form of atomic group or cluster, and the lattice of the Si crystal undergoes heavy deformation even when the individual atoms have a small atomic radius. Thereby the regions 21SG cause substantial dilatation.

Third Embodiment

FIGS. 9-13 show the fabrication process of a semiconductor device according to a third embodiment of the present invention, wherein those parts corresponding to the parts explained previously are designated by the same reference numerals and the description thereof will be omitted.

Figure 9:
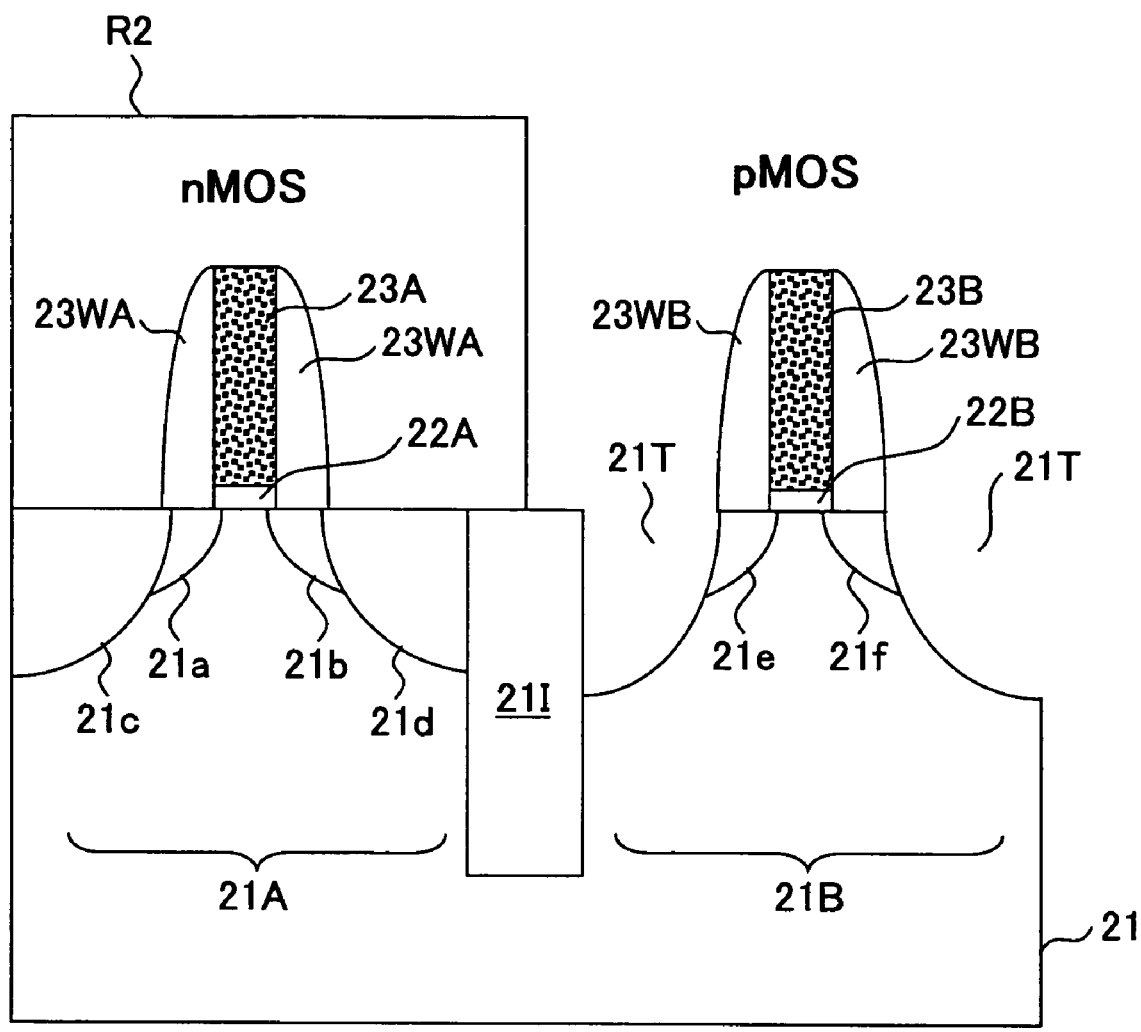
FIGS. 9-12 are diagrams showing the fabrication process of a CMOS integrated circuit device according to a third embodiment of the present invention.

Referring to FIG. 9, the present embodiment covers the device region 21A, after the step of FIG. 4 explained before, with a resist pattern R2, and applies a wet etching process to the part of the silicon substrate 21 corresponding to the device region 21B for the part located at respective outer sides of the sidewall insulation films 23WB, to form trenches 21T in correspondence to the regions 21SG'.

Figure 10:
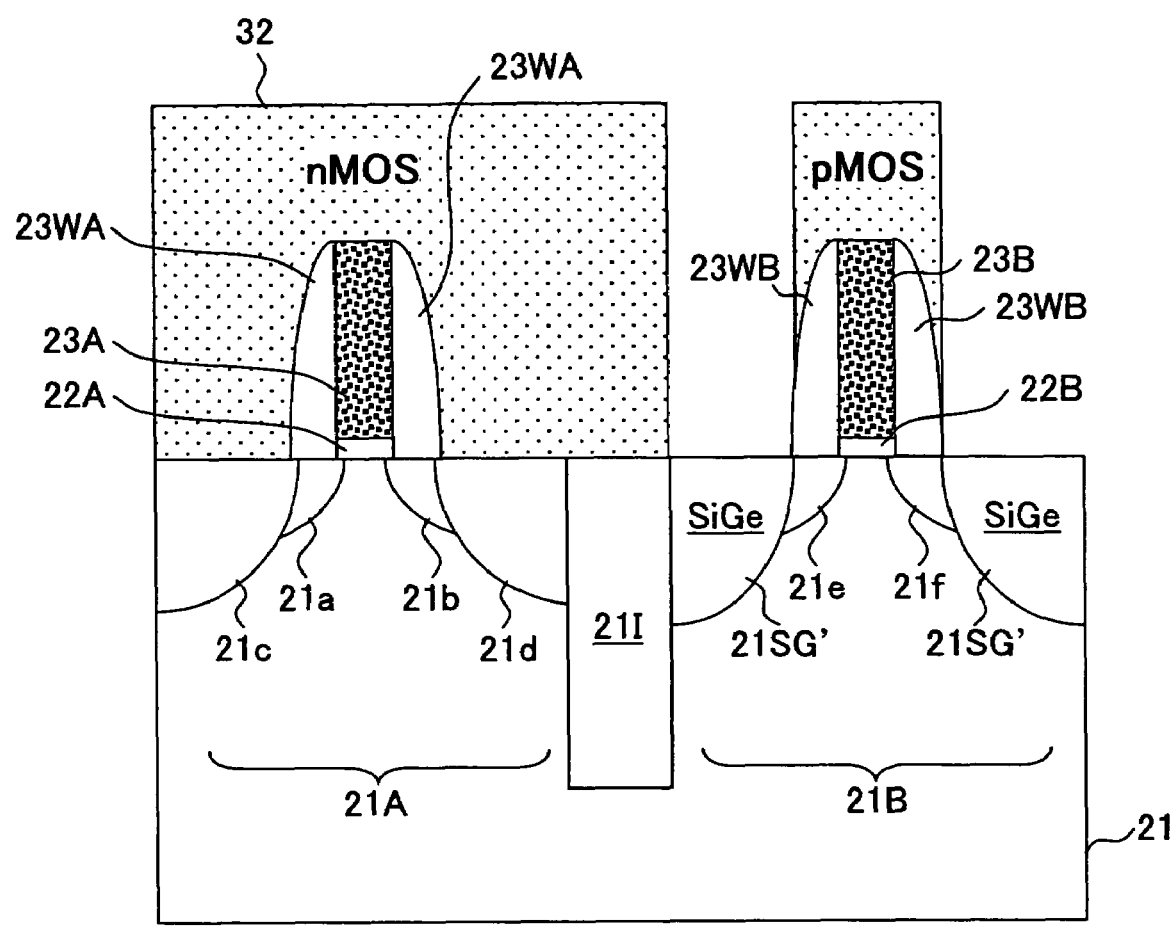

Further, in the step of FIG. 10, the entire surface of the device region 21A and a part of the device region 21B corresponding to the gate electrode 23B are covered by a CVD oxide pattern 32, such that the foregoing trenches 21T are exposed, and the trenches 21T are filled with an amorphous SiGe layer by conducting a CVD process that uses SiH$_4$ and GeH$_4$ as a source gas. Thereby, the regions 21SG' are formed.

Figure 11:
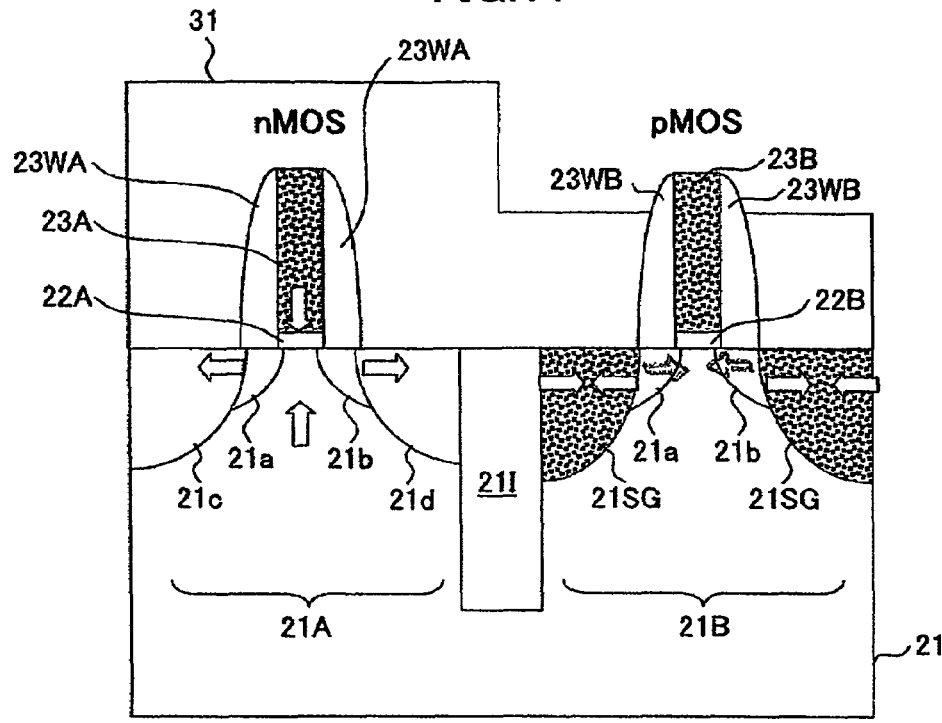

Further, in the step of FIG. 11, the foregoing CVD oxide film pattern 32 is removed, and a CVD oxide mask identical with the CVD oxide mask 31 used with the step of FIG. 6 is formed. Further, by applying a rapid thermal annealing process in this state at about 1000° C. for several seconds, the SiGe regions 21SG' and the gate electrode 23A are crystallized, and the amorphous SiGe regions 21SG' are converted to polycrystal regions 21SiGe. With this, desired stresses are induced respectively in the device regions 21A and 21B.

Figure 12:
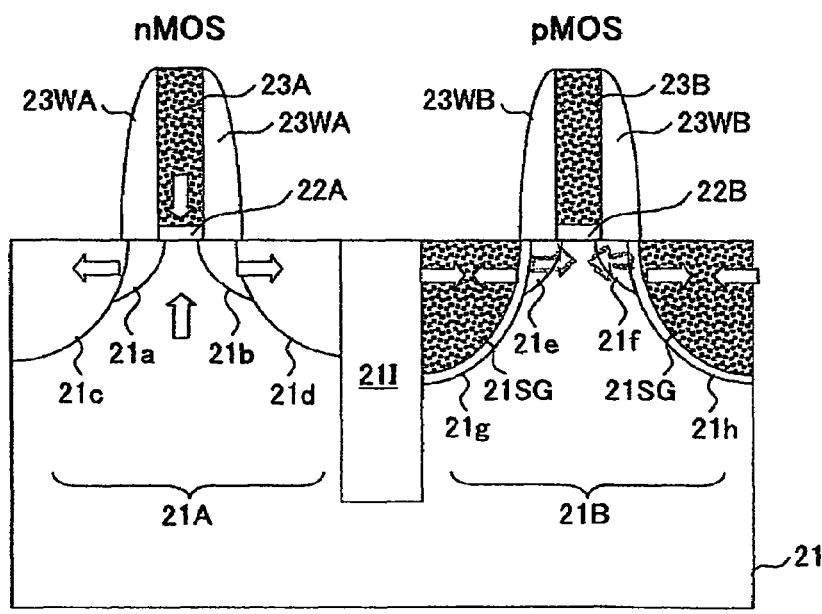

Further, in the step of FIG. 12 corresponding to the step of FIG. 7, impurity ions of p-type are introduced into the device region 21B by way of ion implantation, and the source and drain regions 21g and 21h of p$^+$-type are formed so as to enclose the respective SiGe polycrystalline regions 21SG except for the substrate surface.

In the present embodiment, it is also possible to carry out ion implantation of In or cluster ions in the step of FIG. 10 while using the CVD oxide film 32 as a mask, similarly to the step of FIG. 5.

Further, the present invention is not limited to the embodiments described heretofore, but various variations and modifications may be made without departing from the scope of the invention.

What is claimed is:

1. A p-channel MOS transistor, comprising:
   a monocrystalline silicon substrate;
   a gate electrode formed on said monocrystalline silicon substrate in correspondence to a channel region therein via a gate insulation film, said gate electrode carrying sidewall insulation films on respective sidewall surfaces thereof; and
   monocrystalline source and drain regions of p-type formed in said monocrystalline substrate at respective outer sides of said sidewall insulation films,
   each of said source and drain regions enclosing a polycrystal region of p-type SiGe mixed crystal, said polycrystal region of SiGe mixed crystal accumulating therein a compressive stress,
   wherein said polycrystal regions of p-type SiGe mixed crystal in said source and drain regions apply a compressive stress to said channel region,
   said polycrystal regions being formed at respective outer sides of said sidewall insulation films, each of said source and drain regions enclosing said polycrystal region of p-type SiGe mixed crystal being monocrystalline.

2. The p-channel MOS transistor as claimed in claim 1, wherein said polycrystal region comprises polysilicon containing an impurity element having an atomic radius larger than an atomic radius of Si.

3. The p-channel MOS transistor as claimed in claim 1, wherein said polycrystal region comprises polysilicon containing an impurity element in the form of a cluster of atoms constituting said impurity element.

4. The p-channel MOS transistor as claimed in claim 1, wherein said polycrystal region comprises a SiGe polycrystal.

5. The p-channel MOS transistor as claimed in claim 1, wherein said SiGe polycrystal region contains Ge with a concentration near a solubility limit of Ge in a Si crystal.

6. The p-channel MOS transistor as claimed in claim 1, wherein said SiGe polycrystal region contains Ge with a concentration exceeding a solubility limit of Ge in a Si crystal.

7. The p-channel MOS transistor as claimed in claim 2, wherein said polycrystal region contains said impurity element with a concentration near a solubility limit of said impurity element in a Si crystal.

8. The p-channel MOS transistor as claimed in claim 2, wherein said polycrystal region contains said impurity element with a concentration exceeding a solubility limit of said impurity element in a Si crystal.

9. The p-channel MOS transistor as claimed in claim 2, wherein said impurity element comprises any of In and Ge.

* * * * *